United States Patent [19]
Talbott

[11] Patent Number: 5,997,171
[45] Date of Patent: Dec. 7, 1999

[54] METHOD AND SYSTEM FOR DIGITAL DATA STORAGE, ABSTRACTION AND COMPRESSION TO PRESERVE THE MOST USEFUL CHARACTERISTICS OF THE DATA

[75] Inventor: Marvin T. Talbott, Plano, Tex.

[73] Assignee: Texas Instruments Incorporated, Dallas, Tex.

[21] Appl. No.: 07/949,362

[22] Filed: Sep. 23, 1992

Related U.S. Application Data

[63] Continuation of application No. 07/465,622, Jan. 19, 1990, abandoned, which is a continuation of application No. 07/229,804, Aug. 8, 1988, abandoned, which is a continuation of application No. 06/827,696, Feb. 10, 1986, abandoned.

[51] Int. Cl.$^6$ .............................. G06F 17/40; G06F 3/00
[52] U.S. Cl. .............. 364/550; 364/715.02; 364/715.06; 364/221.4; 364/224.2; 364/239; 364/258.4; 364/920; 364/926.1; 364/964; 364/DIG. 1; 364/DIG. 2; 360/6; 395/872
[58] Field of Search ...................................... 395/400, 800, 395/600, 872; 364/178, 557, 558, 550, 554, 556, 572, 715.02, 715.06, 221.4, 224.2, 239, 258.4, 920, 926.1, 964; 358/261.1, 426; 374/102; 360/6

[56] References Cited

U.S. PATENT DOCUMENTS

| | | | |
|---|---|---|---|
| 3,439,342 | 4/1969 | Barton | 364/900 |
| 3,504,164 | 3/1970 | Farrell et al. | 364/900 |
| 3,514,759 | 5/1970 | Watanabe et al. | 364/900 |
| 3,946,364 | 3/1976 | Codomo et al. | 364/900 |
| 4,092,677 | 5/1978 | Saran | 358/261.4 |
| 4,114,442 | 9/1978 | Pratt | 364/557 |
| 4,121,574 | 10/1978 | Lester | 364/557 |
| 4,234,926 | 11/1980 | Wallace et al. | 364/900 |
| 4,365,307 | 12/1982 | Tatsuwaki et al. | 364/557 |
| 4,372,692 | 2/1983 | Thomae | 364/557 |
| 4,409,670 | 10/1983 | Herndon et al. | 364/424.06 |
| 4,432,052 | 2/1984 | McDonough et al. | 364/200 |
| 4,521,847 | 6/1985 | Ziehm et al. | 371/7 |
| 4,553,223 | 11/1985 | Bouhelier et al. | 364/900 |
| 4,604,699 | 8/1986 | Borcherdt et al. | 364/420 |
| 4,616,320 | 10/1986 | Kerr et al. | 364/421 |
| 4,636,093 | 1/1987 | Nagasaka et al. | 364/557 |
| 4,642,785 | 2/1987 | Packard et al. | 364/557 |
| 4,644,481 | 2/1987 | Wada | 364/557 |
| 4,715,002 | 12/1987 | Vernon et al. | 364/422 |
| 4,718,004 | 1/1988 | Dalal | 364/200 |
| 4,718,776 | 1/1988 | Gilland et al. | 364/557 |

OTHER PUBLICATIONS

J. E. Tame, *Credit and Load Management System for an Electricity Utility*, Electronics & Power, vol. 27 No. 10, pp. 705–707.

*Primary Examiner*—Thomas G. Black
*Assistant Examiner*—Jack M. Choules
*Attorney, Agent, or Firm*—Richard B. Havill; Leo N. Heiting; Richard L. Donaldson

[57] ABSTRACT

Data is digitally sampled at intervals, and these samples are stored for a fixed period. During this period the samples are also processed to select certain characteristics, such as maximum, minimum, average, etc., and these abstract indicators are stored and updated. Then, at some longer interval, the abstract is stored in another data block, and this data block of abstracts is also continuously monitored to select the maximum, minimum, etc., to produce a higher abstracted sample. The process of storage of samples and continuous selection can be repeated for even higher abstraction. Thus, the important characteristics are preserved, but the quantity of data to be stored is greatly reduced.

6 Claims, 2 Drawing Sheets

```
While  (continue_sampling = true)  Do
begin
When  data_read_time Do
begin
Get_data (data)
put_data (data)  in block_1
Update (block_1_abstraction_record)
If full (block_1)  Then
put_data (block_1_abstraction_record)  in block_2
Update (block_2_abstraction_record)
If full (block_2)  Then
put_data (block_2_abstraction_record)  in block_3
Update (block_3_abstraction_record)
If full (block_3) Then
Write (block_3_abstraction_record)  to disk
clear (block_3)
Endif
clear (block_2)
Endif
clear (block_1)
Endif
end
end
```

*FIG. 3*

METHOD AND SYSTEM FOR DIGITAL DATA STORAGE, ABSTRACTION AND COMPRESSION TO PRESERVE THE MOST USEFUL CHARACTERISTICS OF THE DATA

This application is a Continuation of application Ser. No. 07/465,622, filed Jan. 19, 1990, now abandoned which is a continuation of Ser. No. 07/229,804, filed Aug. 8, 1988, now abandoned, which is a continuation of Ser. No. 827,696, filed Feb. 10, 1986, now abandoned.

BACKGROUND OF THE INVENTION

This invention relates to digital data storage and compression and more particularly to a method of abstracting and compressing sampled data.

In process monitoring or other detection and recording systems, the availability of low-priced memory has made the task of acquiring and storage of information a relatively easy one. Very large quantities of data can be acquired and stored at low cost. Even so, the storage medium is finite and, when sampling rates are high, the limits of the system are reached at some point and old data must be purged. But there are many situations where the older data may be the most useful, at least as to certain characteristics such as maximum, minimum, average, standard deviation, catastropic events, etc.

It is the object of this invention to provide a method of abstracting and compressing digital data in a manner that preserves the most useful characteristics of the data but yet eliminates the need for vastly redundant data storage capability.

SUMMARY OF THE INVENTION

In accordance with one embodiment of the invention, a method is provided for abstracting and compressing sampled data automatically without manual intervention. Raw data is digitally sampled at intervals and these samples are stored for a fixed period. During this period the samples are also processed to select certain characteristics, such as maximum, minimum, average, etc., and these abstract indicators are stored and updated. Then, at some longer interval, the abstract is stored in another data block, and this data block of abstracts is also continuously monitored to select the maximum, minimum, etc., to produce a higher abstracted sample record. The process of storage of samples and continuous selection can be repeated for even higher abstraction. Thus, the important characteristics are preserved, but the quantity of data to be stored is logarithmically reduced.

BRIEF DESCRIPTION OF DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 3 is an algorithm describing the data abstraction and storage method in accordance with the present invention.

DETAILED DESCRIPTION OF SPECIFIC EMBODIMENT

Figure 1:
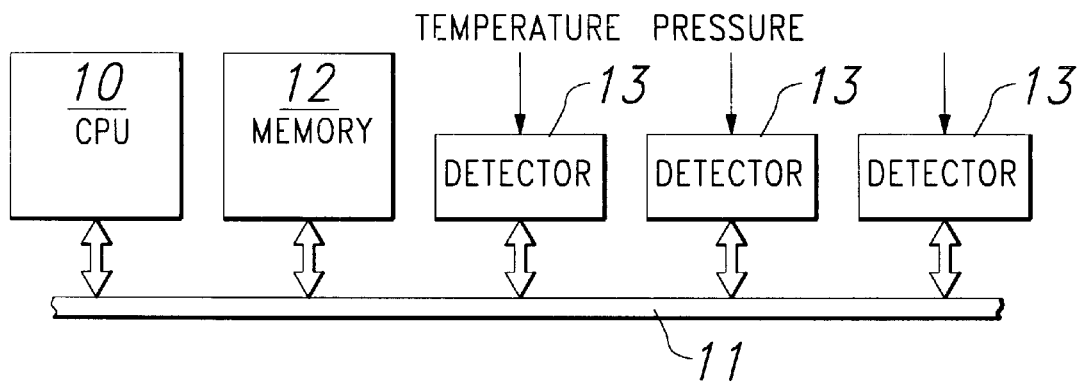
FIG. 1 is a block diagram of a digital data sampling system according to the invention.

Referring to FIG. 1, one embodiment of the invention is a data sampling system which may comprise a CPU 10 connected by a system bus 11 to a memory 12 for program and data storage, and to one or more data detector devices 13. The data detector devices 13 may be, for example, digital thermometers, pressure gauges, speedometers, odometers, wind speed detectors, or any device of this nature capable of taking a data sample and producing a digital output. The devices 13 may be self-timed, producing samples at intervals determined by their own clock, or may take a sample upon command from the CPU 10. The CPU is of standard design, such as a microprocessor device of the 8086 or 6800 type, for example, or a microcontroller such as the TMS 7000 is used. The system bus 11 would usually consist of a data bus, an address bus and a control bus, although the address and data busses may be multiplexed, depending upon the CPU chosen. Thus, the system described has the capability of periodically sampling the digital data from the one or more detectors 13 and storing the samples in the memory 12. The memory 12 may consist of RAM, or may also include disk storage, as well as ROM (or other non-volatile memory) for program storage, if needed. The memory may contain separate storage areas for storing data corresponding to each of the detectors 13.

According to the invention, a method of aging and compacting the sample data Is employed. If, for example, five detectors 13 are used, each sampled every minute (assuming one byte per sample), then 7200 bytes of storage are needed for each day's data. If the system is used in a vehicle or remote facility, where months may go by before the data is used, the data storage would far exceed the capability of typical low-powered microcontrollers. Ordinarily, the oldest data is purged as new data fills up the memory. However, there are many situations where the old data is valuable, as in the case of engine maintenance; if an engine is overheating, It is very useful to know (1) when did it start, (2) has it always been running hot, (3) did the temperature gradually build up or did it fall suddenly, (4) were there periodic peaks correlated with other factors, etc. These questions can be answered without resorting to permanent storage of mass quantities of data.

Figure 2:
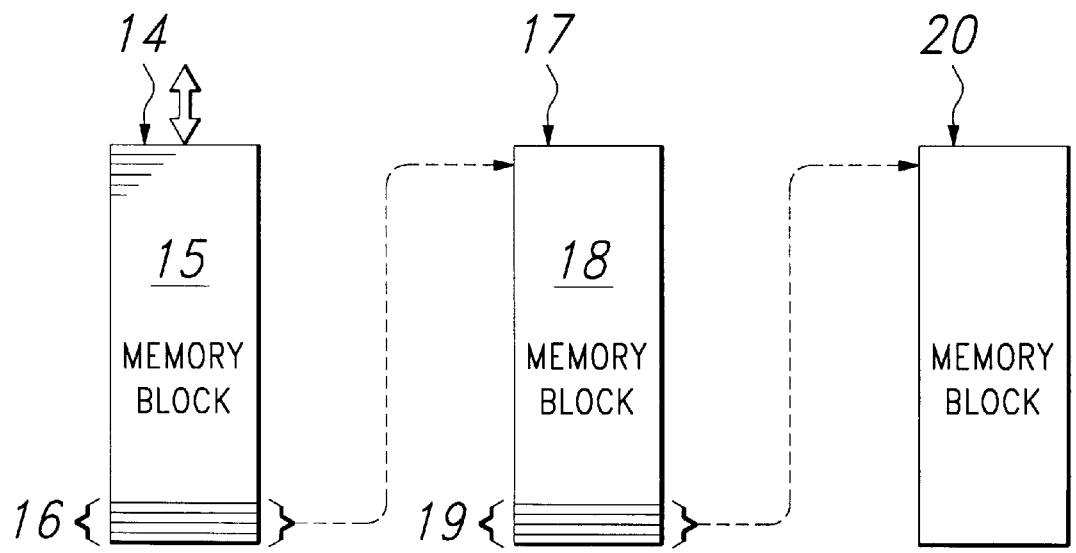
FIG. 2 is a memory map of the data sample storage in the system of FIG. 1.

Referring to FIG. 2, a map of the part of the memory 12 containing the sample data for one of the detectors 13 is shown, according to the invention. The first block 14 contains the most current "real-time" data In the bulk of the memory locations 15. The CPU stores the raw data samples one-at-a-time as they come from the detector 13 in this block area 15, the memory functioning either as a push-down stack or by sequentially addressing the locations. In the time between samples, the CPU accesses the data collected so far in the area 14 and selects and copies the values for the highest, the lowest, the average and the standard deviation of the data into the locations 16. Other identifying information such as the time and date of the sampling period may be stored with the data words selected for in the locations 16. When the area 15 is filled, the current abstract data in locations 16 is copied into the first set of locations in a second block 17, and this continues with another set of abstract information being copied into area 18 of block 17 for each period that it takes to fill the area 14. A similar process of abstracting the abstract data from block 17 is performed by the CPU 10; that is, the maximum, minimum, average, etc. each with a time-stamp, from the data of block 15 is continuously selected and stored in certain locations 19 of block 17, then when the area 18 of block 17 is filled the current values in locations 19 are copied to a block 20. In the example of one sample per minute from a detector 13, the first block 14 may contain 1440 bytes in the area 15 to store one 24-hour period of data, then the block 17 of roughly the same size could contain about one year of abstract data with time stamps, while the block 20 could contain abstracted data for many years in a much smaller block.

An additional set of the blocks 14, 17 and 20 are located in the memory 12 for each data detector 13. Part of the memory 12 may be EPROM or EEPROM so that the sample data or abstract data is not lost when the power is turned off. For example, the blocks 17 and 20 may be in EEPROM but the block 14 in volatile RAM in an automotive application, so the abstract data is kept even when the supply voltage is removed.

Rather than samples of continuous data, the detectors 13 may be producing an indication of events, such as valve opening or closing, or a vehicle passing a location, or a radio signal received, along with a time-stamp. Or, in manufacturing control systems, the lot identification tag could be one of the items of the data detected.

The CPU 10, memory 12, bus 11 and even the detectors 13 may be constructed in a single special-purpose semiconductor device such as the microcontroller disclosed in U.S. Pat. No. 4,432,052 assigned to Texas Instruments. The maximum/minimum detect functions, as well as the memory addressing and copying functions, would be implemented by programming the CPU of such a device using its standard instruction set as disclosed in the Patent.

As an example, algorithmic implementation of the device, a simple system having a CPU of the 8086 or 6800 type or a microcontroller such as a TMS 7000 connected to the system bus with a single digital input device (e.g. a thermometer), and a memory will be provided with the memory divided into three partitions. In the pseudo-code implementation, many functions will be assumed to exist for memory manipulation and other services. Given a target machine and language, these functions could be further coded and a true implementation achieved as set forth in FIG. 3.

The algorithm of FIG. 3 assumes a memory management technique is used in the functions full( ), clear( ) and put_data( ). Most likely, a pointer into the memory partition would be incremented by the appropriate record length and checked against a constant value to see if the memory block is full. The variables block_n and block_n_abstraction_record are both pointers to their respective places in the memory partitions. When the third memory partition becomes full, its abstraction record is written to disk or some other form of non-volatile storage. This is a simple extension of the device. The algorithm of FIG. 3 could easily be modified to act dynamically and use an indefinite number of memory blocks instead of three or some other specific number. This would allow the program to most efficiently use whatever memory was available.

Another example of a use of the concept of the invention is in a radar or sonar type of application. Here the detector 13 produces a digital indication of the signal received, and angular position of the antenna of a scanning system is employed. The samples in the case of a radar system would be on a microsecond or nanosecond time scale, as distinguished from an automotive application where sampling is on a scale of seconds, minutes or longer. Samples from the detector 13 in the radar system are stored in the area 15 of block 14 along with time information. If dopplar radar is used, the frequency of the return signal is also stored. Most of the samples will be background noise or clutter; the operator is interested in returns deviating from the noise level. So, the abstracting function may be that of selecting all deviations and storing these samples in block 17. Then, based on the amplitude, frequency and time information contained in the abstracts in block 17, if necessary, further abstraction to eliminate trivial or unwanted returns using whatever criteria the user programs into the CPU processing for this tag produces usable target data in block 20 for presentation or direct utilization. Instead of one CPU or processor, there may be parallel processing which may be especially useful here due to the speed requirement. In any event, the abstracted output is target location and speed or the like instead of a massive amount of no-return information with a few signals interspersed.

Another method of compacting the data in the system described above is to include a tag bit in the output of the detector 13 to Indicate that a certain condition is present, making the data useful. For example, if the detector is reading the angular position of the flaps in an aircraft, the data may be of interest only when the flaps-down control from the cockpit is received, i.e., the pilot has activated a lever to lower the flaps. Thus, a bit is set when this control signal is present, and if so the data of angular position is recorded, otherwise the data is ignored. A record is thus maintained of the angular position vs. time for the periods that the flaps are activated. The CPU 10 could be programmed to scan the compacted historical data in the banks 14, 17 and 20 to detect any trend or deviation indicating abnormal operation, and to activate a signal or alarm. Or, the data could be periodically scanned by test equipment connected to the aircraft in routine maintenance. The use of the tag bit functions to reduce the amount of data needed to be stored.

Another example of utility of the concept is in cattle breeding; a device containing a thermal detector, a single I/C chip with the system of FIG. 1, and a lithium battery is implanted under the skin of a cow, and the temperature of the cow is sampled several times a day and stored in block 14 for an interval of several weeks, then the samples are processed to detect the temperature change indicating the fertile period, which is stored in block 17. Over many months, data is collected to indicate the exact cycle, then, by removing the implant or detecting the contents of block 17 through the skin by a probe, the information needed for selecting the exact time of insemination is available, reducing the cost of the operation.

A further example of utility is in monitoring of human health conditions, such as blood pressure, pulse rate, insulin level, etc.

The data samples being collected from the detectors 13 are ordinarily digital data words of 8-bit, 16-bit or 32-bit size, depending upon the system complexity. The Information being measured, as mentioned above, may be temperature, pressure, voltage, current, resistance, light, radiation, frequency, sound, weight, ph factor, or any detectable information of this type.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of storing data in an electronic digital system comprising the machine executed steps of:

a) repeatedly detecting a condition at spaced apart time intervals to produce electrical digital representation of the detected condition for each of said spaced apart time intervals, b) providing a first memory and a second memory, c) automatically storing each of said electrical digital representations in said first memory to provide stored electrical digital representations in said first memory, d) examining said stored electrical digital representations in said first memory for predetermined criteria in said stored electrical digital representations and generating predetermined first abstracted electrical digital representations from said stored electrical digital representations representing said predetermined criteria and representing a first time period much longer than one of said spaced apart time intervals including the space between consecutive said spaced apart time intervals, e) storing said first abstracted electrical digital representations in said second memory, and f) displacing some of said stored electrical digital representations in said first memory with other stored electrical digital representations after generating said first abstracted electrical digital representations, g) wherein said first abstracted electrical digital representations correspond to a maximum value and a minimum value of said condition over a plurality of said spaced apart time intervals.

2. A method according to claim 1 wherein said first abstracted electrical digital representations include time and date information for said maximum value and said minimum value.

3. A method of storing data in an electronic digital system comprising the machine executed steps of:

a) repeatedly detecting a condition at spaced apart time intervals to produce electrical digital representation of the detected condition for each of said spaced apart time intervals, b) providing a first memory and a second memory, c) automatically storing each of said electrical digital representations in said first memory to provide stored electrical digital representations in said first memory, d) examining said stored electrical digital representations in said first memory for predetermined criteria in said stored electrical digital representations and generating predetermined first abstracted electrical digital representations from said stored electrical digital representations representing said predetermined criteria and representing a first time period much longer than one of said spaced apart time intervals including the space between consecutive said spaced apart time intervals, e) storing said first abstracted electrical digital representations in said second memory, and f) displacing some of said stored electrical digital representations in said first memory with other stored electrical digital representations after generating said first abstracted electrical digital representations, further including the machine executed steps of:

g) providing a third memory, examining said stored first abstracted electrical digital representations stored in said second memory for second predetermined criteria and generating second abstracted electrical digital representations from said first abstracted electrical digital representations representing said second predetermined criteria and representing a second time period much longer than said first time period, h) storing said second abstracted electrical digital representations in said third memory, and i) displacing said stored first abstracted electrical digital representations stored in said second memory with other first abstracted electrical digital representations after generating said second abstracted electrical digital representations.

4. An electronic digital system for storing data comprising:

a) a detector for repeatedly detecting a condition at spaced apart time intervals and producing a digital representation of the condition for each such spaced apart time interval, b) a first memory connected to said detector for storing each said digital representation for a predetermined Plurality of said spaced apart time intervals, c) a processor connected to said first memory for examining said digital representations for each of said predetermined plurality of spaced apart time intervals stored in said first memory and generating first abstracted digital signals representative of predetermined criteria obtained from said stored digital representations over a first time period much longer than one of said spaced apart time intervals including the space between consecutive spaced apart time intervals, d) a second memory storing said first abstracted digital criteria, e) said digital criteria in said first memory being displaced by other digital criteria after said processor has generated said first abstracted digital criteria, f) wherein said first abstracted digital representations correspond to a maximum value and a minimum value of said condition over a plurality of said spaced apart time intervals.

5. An electronic digital system for storing data comprising:

a) a detector for repeatedly detecting a condition at spaced apart time intervals and producing a digital representation of the condition for each such spaced apart time interval, b) a first memory connected to said detector for storing each said digital representation for a predetermined plurality of said spaced apart time intervals, c) a processor connected to said first memory for examining said digital representations for each of said predetermined plurality of spaced apart time intervals stored in said first memory and generating first abstracted digital signals representative of predetermined criteria obtained from said stored digital representations over a first time period much longer than one of said spaced apart time intervals including the space between consecutive spaced apart time intervals, d) a second memory storing said first abstracted digital criteria, e) said digital criteria in said first memory being displaced by other digital criteria after said processor has generated said first abstracted digital criteria, f) wherein said first abstracted digital representations include time and date information for a maximum value and a minimum value.

6. An electronic digital system for storing data comprising:

a) a detector for repeatedly detecting a condition at spaced apart time intervals and producing a digital representation of the condition for each such spaced apart time interval, b) a first memory connected to said detector for storing each said digital representation for a predetermined plurality of said spaced apart time intervals, c) a processor connected to said first memory for examining said digital representations for each of said predetermined plurality of spaced apart time intervals stored in said first memory and generating first abstracted digital signals representative of predetermined criteria obtained from said stored digital representations over a first time period much longer than one of said spaced apart time intervals including the space between consecutive spaced apart time intervals, d) a second memory storing said first abstracted digital criteria, e) said digital criteria in said first memory being displaced by other digital criteria after said processor has generated said first abstracted digital criteria, f) wherein said processor examines said stored first abstracted digital representations, selects second abstracted digital representations of said first abstracted digital representation, and stores said second abstracted digital representation over a second time period much longer than said first time period, wherein said first abstracted digital representations are replaced in said memory by other first abstracted digital representations after selection of said second abstracted digital representations.

* * * * *